United States Patent
Sage et al.

(10) Patent No.: US 6,642,332 B1
(45) Date of Patent: Nov. 4, 2003

(54) ORGANIC SEMICONDUCTORS BASED ON STATISTICAL COPOLYMERS

(75) Inventors: Ian C Sage, Worcester (GB); Emma L Wood, Worcester (GB); William J Feast, Durham (GB); Richard J Peace, Bedford (GB)

(73) Assignee: Qinetiq Limited, Hants (GB)

( * ) Notice: Subject to any disclaimer, the term of this patent is extended or adjusted under 35 U.S.C. 154(b) by 0 days.

(21) Appl. No.: 09/959,670

(22) PCT Filed: Apr. 27, 2000

(86) PCT No.: PCT/GB00/01636
§ 371 (c)(1),
(2), (4) Date: Apr. 30, 2002

(87) PCT Pub. No.: WO00/69931
PCT Pub. Date: Nov. 23, 2000

(30) Foreign Application Priority Data

May 12, 1999 (GB) .............................. 9910963

(51) Int. Cl.$^7$ .............................. C08F 26/06
(52) U.S. Cl. .............. 526/258; 526/310; 526/263; 526/340
(58) Field of Search ................ 526/310, 263, 526/340, 258

(56) References Cited

U.S. PATENT DOCUMENTS 5,231,329 A * 7/1993 Nishikitani et al. ......... 313/503
5,571,619 A * 11/1996 McAlpin et al. ............ 428/364
5,674,635 A * 10/1997 Hsieh et al. ................ 428/690

FOREIGN PATENT DOCUMENTS

EP 0 992 564 A 4/2000
JP 01105954 * 4/1989

OTHER PUBLICATIONS

Feast W J et al.; "Poly (4–Vinyltriphenylamine): Syntheses And Application As A Hole Transport Layer In Light–Emitting Diodes"; Polymer Bulletin, DE, Springer Verlag. Heidelberg; vol. 42, NR. 2; pp. 167–174; XP000804956 and Abstract.

Heischkel Y et al; "Synthesis of ABC–Triblock Copolymers For Light Emitting Diodes"; Macromolecular Chemistry And Physics, DE, Wiley VCH, Weinheim; vol. 199, NR. 5; pp. 869–880; XP000774632.

Patent Abstract of Japan; vol. 1997, No. 11; Nov. 28, 1997; & JP 09 188756 A (Kemipuro Kasei KK); Jul. 22, 1997; Abstract.

Abstract of Japan 01105954; Apr. 24, 1989; Hiroshi, T. et al; "Durable Electrophotographic Photoconductor Sensitive In Short Wavelength Region".

Abstract; Alekseeva, T A et al; "Polarographic Study of Vinyl Derivatives of Diaryloxazole and Diaryloxadiazole"; Journal, Zh. Obshch. Khim; 1967, 37(9), 1943–8.

Abstract; Manecke, G. et al; "3,4–Diaminostyrene"; Journal, Makromol. Chem.; 1973, 171, 49–55.

* cited by examiner

*Primary Examiner*—Ling-Siu Choi
(74) *Attorney, Agent, or Firm*—Nixon & Vanderhye P.C.

(57) ABSTRACT

This invention relates to statistical copolymers of general formula (I) and their use in organic semiconductor devices: wherein m and j are the average number of repeat units of A and B such that: $m=0.1-0.9$, $j=1-m$, $Q=10-50000$; A and B are independently selected from hole transporting groups and electron transporting groups and are statistically distributed along the polymer chain; X and Z are selected from H, CN, F, Cl, Br, $CO_2CH_3$.

10 Claims, 8 Drawing Sheets

ORGANIC SEMICONDUCTORS BASED ON STATISTICAL COPOLYMERS

This invention concerns new compounds and the use of such compounds as electrically conducting and electronically active materials. In particular it relates to the use of sidechain random, or more specifically statistical copolymer systems comprising covalently linked polymer chains bearing electrically active organic substitution.

It is recognised that a variety of organic compounds can be made to conduct electricity. The mechanism of electrical conduction may be either ionic conduction or electronic conduction. Ionic conduction is most important in blends of polymer materials with ionic compounds which may be regarded as solutes in the polymer. Movement of the ions under an applied electric field results in a flow of electric current. Typical materials in which ionic conductivity is important include blends of lithium salts in polymers such as poly(ethylene oxide).

Electronic conduction occurs in organic compounds even in the absence of addition of ionic salts. Various classes of organic compounds show this class of conduction, including conjugated polymers such as poly(acetylene), poly(phenylene vinylene) and poly(thiophene). This class of conduction is also found in molecular solids of low molecular mass such as N,N'-diphenyl-N,N'-ditolylbenzidine and aluminium tris 8-hydroxyquinolinate. Polymers which do not possess a conjugated main chain structure can also show electronic conductivity. Such polymers include poly(vinyl carbazole) as a known example.

Electronic conduction in these organic compounds relies on the insertion of electrical charge into the materials. Such electrical charge may be introduced in a variety of known ways, including doping with an oxidising or reducing agent, by chemical doping with a charge transfer reagent, or by direct insertion of positive or negative electric charge from a conducting electrode. Known examples of such introduction of charge include the chemical doping of poly(acetylene) with the oxidising agent iodine, doping of poly(vinyl carbazole) with the charge transfer reagent trinitrofluorenone, and the injection of charge into evaporated thin films of 3-biphenyl-5-(4-t-butylphenyl)oxadiazole from a low work function electrode such as a magnesium metal electrode by application of a negative potential to the electrode. This injection of charge may also be regarded as an electrochemical reduction of the conducting material, or as electrochemical doping of the material. Other electronically conducting organic compounds may be subjected to charge injection by a positive potential, which is commonly applied via an electrode composed of a high work function metal such as gold. Such charge injection is commonly described as injection of positive charges denoted holes, and this description is understood to be equivalent to the extraction of electrons from the conducting material. A further route to generation of charge in organic solids is the ionisation of molecules of the solid under the influence of an electric field or of incident light, or both. In this case, an electron is removed from a molecule of the material, and captured by another molecule, or by a different part of the molecule. In this way, a pair of separated positive and negative charges is produced, movement of either or both of which may contribute to conduction in the material.

Conduction within electronically conducting organic solids involves, in practical materials, the transfer of electrical charge from one molecule to another. Such transfer of charge is described by a charge hopping or charge tunnelling mechanism which may allow an electron to overcome the energetic barrier between different molecules or molecular sub-units. In systems such as conjugated polymers including poly(acetylene) and poly(phenylenevinylene) charge can also flow along the conjugated chain by movement of charged discontinuities in the regular bonding sequence of the polymer. In such cases, charge will normally be transferred through the bulk sample by a large number of individual molecules, and hopping or tunnelling remains an important mechanism.

The use of organic electrically conducting materials as semiconductors in the fabrication of electronic devices has been explored by many investigators. Field effect transistors have been fabricated from organic compounds such as poly(acetylene), pentacene, and poly(phenylenevinylene). Light emitting diodes have been demonstrated using a wide range of organic and molecular solids, including N,N'-diphenyl-N,N'-ditolylbenzidine, aluminium tris 8-hydroxyquinolinate, 3-biphenyl-5-(4-t-butylphenyl)oxadiazole and poly(phenylene vinylene). Preferably, such light emitting diodes are fabricated using at least two organic semiconductors which transport charge respectively by transport of holes and electrons. Such multilayer diodes tend to attain higher efficiency than single layer devices, by trapping the charge carriers in the device until carrier recombination and light emission can take place. Photovoltaic devices have been fabricated using compounds such as copper phthalocyanine and perylene bisbenzimidazole. Photoconductive materials have been prepared and are recommended for use as sensitive layers in electrophotography, photocopying and printing applications. Such photoconductive compositions include compositions based on poly(vinylcarbazole) doped with trinitrofluorenone.

Conducting polymers may be used as components of optical storage and switching equipment by using the photorefractive effect. Photorefractive layers combine the capacity for photogeneration of charge, transport of charge carriers by diffusion or under an applied field and a linear electro-optic coefficient. Such properties may be obtained by addition of selected dopants to a conducting polymer. Suitable dopants for inducing the capability for photogeneration of charge include $C_{60}$ fullerene. Suitable dopants to provide a linear electro-optic coefficient include dimethylamino nitrostilbene.

Many shortcomings have been identified in organic conducting materials described in the prior art. Among these shortcomings, chemical stability is an important parameter. Poly(acetylene), which shows a high electrical conductivity in the doped state, is converted to a non-conducting product on exposure to air, and must be handled and used in an inert atmosphere. Poly(phenylenevinylene) is believed to undergo oxidation of the conjugated double bonds in the main chain, yielding non-luminescent oxidation products. Further degradation mechanisms have been identified or proposed for poly(phenylenevinylene) when it is incorporated in devices, including sensitivity to ambient ultraviolet radiation. Molecular solids such as N,N'-diphenyl-N,N'-ditolylbenzidine may undergo crystallisation, changes in morphology, or melting in operating devices. These effects may cause premature failure or loss in efficiency of the device.

A further important shortcoming which is common in many organic conducting materials rests in the difficulty and high cost of processing the materials. Both poly(acetylene) and poly(phenylenevinylene) are insoluble and infusible materials which are prepared for use in devices by use of a precursor polymer route. Typically a soluble precursor polymer is first synthesised and deposited onto a prepared substrate. A combination of heat and vacuum is then used to chemically convert the precursor polymer into the target product, usually with elimination of smaller volatile molecules of one or more by-products. Processing of the target polymer to a dense film in bulk quantities requires critical control of this step which moreover entails the use of costly and time consuming vacuum processing stages. The final polymer is difficult to further process, and steps such as patterning and lithography are difficult to accomplish. Many attempts have been made to provide solution processable organic conductors. Substitution of alkyl, alkoxy and other flexible organic radical onto the polymers is understood to improve their solubility and processibility. Such substitution, however, may also commonly reduce the mobility of charges in the system, making the product less desirable for device preparation. Said substitution may also change the orbital energies of the system, altering the potential required for charge injection into the material.

Low molecular mass conducting organic materials must be deposited in thin uniform films for use in devices. Such films are commonly deposited by vacuum deposition onto the substrate from an electrically heated boat. This process is relatively time consuming and requires the use of costly high vacuum handling equipment. The time required for use of such equipment is relatively long due to the need for evacuation and outgassing of the materials and equipment at different stages in the process. Therefore this route does not provide means for low cost fabrication of organic semiconductor devices.

One way in which it is known to ease the problems associated with the processing of the materials is to provide single layer devices. This may be done in a number of ways. The use of certain types of polymeric active substances means that the use of more than one layer may not be necessary. It is known to use so-called polymer blends i.e. a mixture of polymers wherein the different functions i.e. electron transporting, hole transporting and in some cases light emitting functions are provided by different polymers. These blends tend to be inefficient for a number of reasons—one of these being they tend to phase separate. The efficiency of a semi-conductor device may be measured or assessed in a number of ways—these methods include measurement of: quantum efficiency which is the number of photons out of the system per electron hole in and power efficiency which is the luminance per Watt.

Other polymer systems have been developed, for example it is known to incorporate both electron-transporting and hole-transporting functions onto a single polymer backbone—for example see Macromol. Chem. Phys., 199, 869–880, 1998 where ABC triblock copolymers for LEDS are described. It is also known to incorporate hole transporting groups or electron transporting groups with chromophores (i.e. light emitters) onto polymer backbones in order to produce statistical copolymers, for example see Bisberg et al, Macromolecules, 1995, 28, 386–89 and Cacialli et al, Synthetic Metals 75, 1995 161–68.

Despite the numerous efforts made up until now there is a continued need for materials suitable for use in semiconductor devices which have at least one of the following properties:

desirable charge transport characteristics, in particular an advantageous combination of electronic work function which is one factor determining the electric potential required to inject charge in to the polymer from a metallic or semiconducting electrode, charge carrier mobility, the ability to afford control over emission wavelength and bandwidth, ease of synthesis from readily available and inexpensive starting materials, solubility, film forming ability and high physical and chemical stability of deposited films of the polymer in storage and in operating devices, greater efficiency.

It has now been unexpectedly found that processable conducting organic polymers may be prepared by the random copolymerisation of various organic derivatives. Such statistical copolymers yield glass forming polymers which contain no additional functional groups which might compromise stability. It is further surprisingly found that the charge mobility in such polymers is high and organic semiconductor devices fabricated from them provide excellent performance. Test devices show no sign of crystallisation of the statistical copolymer. Furthermore the polymers unexpectedly show excellent solubility in common solvents and may be processed into uniform films suitable for device fabrication simply by spin coating from solution. Said polymers therefore satisfy the requirements for fabrication of organic semiconductor devices in large areas by inexpensive and rapid processing methods. According to this invention there are provided statistical copolymers of general Formula I:

Formula I

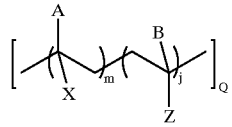

wherein m and j are the average number of repeat units of A and B such that:

m=0.1–0.9, j=1−m,

Q=10–50000;

A and B are independently selected from hole transporting groups and electron transporting groups and are statistically distributed along the polymer chain;

X and Z are independently selected from H, CN, F, Cl, Br, $CO_2CH_3$.

Preferably the electron transporting and hole transporting groups are directly attached to the polymer backbone such that there is a direct bond between an aromatic part of the electron transporting group and the polymer backbone and a direct bond between the hole transporting group and the polymer backbone.

Preferably the direct bond is such that it is formed from a monomer bearing a vinyl group attached directly to the charge-carrying group.

Preferably the hole transporting group is given by the following general Formula II:

Formula II

Where $Ar_1$ is connected to the polymer backbone and is selected from 1,2-phenylene, 1,3-phenylene, 1,4-phenylene, 4,4'-biphenylene, 1,4-naphthylene and 2,6-naphthylene, and B and C are independently selected from groups of structure $Ar_2$, where $Ar_2$ is selected from phenyl, biphenyl, 1-naphthyl and 2-naphthyl, and $Ar_2$ may be optionally substituted with one or two groups independently selected from OR, NRR', and $N(Ar_3)_2$, where R and R' denote $C_1$ to $C_6$ alkyl groups and $Ar_3$ is selected from phenyl, biphenyl, 1-naphthyl and 2-naphthyl and $Ar_3$ may be optionally substituted with one or two groups independently selected from OR, $N(Ar_3)_2$, NRR'.

Preferred groups of Formula II include:

N,N-diphenyl-4-aminophenyl 2-(N,N-diphenyl-6-amino)naphthyl

N,N-bis(4dimethylaminophenyl)-4-amino phenyl

N-phenyl N-4-methoxyphenyl 4-aminophenyl

N-phenyl N-4-dimethylaminophenyl 4-aminophenyl

N-4-methylphenyl N-4-dimethylaminophenyl 4-aminophenyl

N-phenyl N-4-diphenylaminophenyl 4-aminophenyl

N,N-bis-4-diphenylaminophenyl 4-aminophenyl

N-phenyl, N(4,4'-N',N'-diphenylamino-biphenylyl) 4-aminophenyl

N-3-methylphenyl N-(4,4'-N'-phenyl-N'-3-methylphenyl aminobiphenylyl) 4-aminophenyl N- 1-naphthyl, N-(4,4'-N'-phenyl-N'-1-naphthyl aminobiphenylyl) 4-aminophenyl Preferably the electron transporting group is given by the following general Formula III:

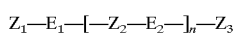   Formula III where $Z_1$ is connected to the polymer backbone and E1 and E2 are chosen from

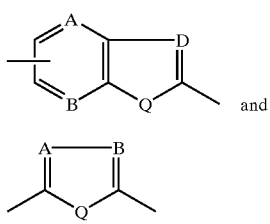

where A, B and D are independently chosen in each ring from CH and N, and Q is chosen in each ring from S, O, NR", CHR", CR"R", CH=CH, N=N, N=CH and N=CR", wherein $Z_1$ and $Z_2$ are single bonds or a group $Ar_4$ which is selected from 1,2-phenylene, 1,3-phenylene, 1,4-phenylene, 4,4'-biphenylene, 1,4-naphthylene and 2,6-naphthylene, $Z_3$ is a phenyl, naphthyl or biphenyl group optionally substituted in one or two positions with $C^1$ to $C_6$ alkyl, R" is chosen from $C_1$ to $C_6$ alkyl groups and aryl groups and n=0,1 or 2.

Preferably the aryl groups for R" are phenyl.

Preferred structures for E1 and E2 in Formula III include:

Oxazole

Oxadiazole

Benzoxazole

Benzthiazole

Quinoxaline

Thiadiazole 1,2,4-triazine

Phenylquinoxaline.

Overall preferred structures for Formula III include:

4-(5-phenyl-1,3,4-oxadiazolyl)phenyl 4-(5-(t-butylphenyl)-1,3,4-oxadiazolyl)phenyl 6-(2,3-diphenyl)quinoxalinyl 6-(2,3-dinaphthyl)quinoxalinyl 4-(5-(t-butylphenyl)-1,3,4-oxadiazolyl)biphenylyl 5-(2-benzoxazolyl-1,4-phenyl-2-benzoxazolyl).

Preferably m=0.3–0.7

Preferably Q=30–1000.

In Formula I the hole and/or electron transporting groups may also act as light emitters (also referred to as luminescent materials), and/or a separate light emitter may be present in devices utilising such materials.

The structural and other preferences are expressed on the basis of desirable charge transport characteristics, in particular an advantageous combination of electronic work function which is one factor determining the electric potential required to inject charge in to the polymer from a metallic or semiconducting electrode, charge carrier mobility, ease of synthesis from readily available and inexpensive starting materials, solubility, film forming ability and high physical and chemical stability of deposited films of the polymer in storage and in operating devices.

It is believed that the statistical copolymers which possess the hole transporters and electron transporters bound directly to the polymer backbone such that there is a direct bond between an aromatic part of the electron transporter and the polymer backbone and there is a direct bond between an aromatic part of the electron transporter and the polymer backbone are particularly advantageous due to there being a reduced so-called parasitic mass attached to the charge carrier.

Compounds of Formula I can be prepared by various routes. Vinyl(triphenylamine), may be prepared by reaction of an iodobenzene with a diphenylamine. Either or both of these starting materials may bear appropriate substitution which is incorporated in the product triphenylamine. The reaction may with advantage be performed in the presence of finely divided copper at elevated temperatures in a solvent such as dibutyl ether, dichlorobenzene etc, according to procedures known in the art and described, for example, by Grimley et al (Org Magn Reson, 15, 296, (1981)), or by Gauthier et al (Synthesis, 4, 383, (1987)). Vinyl substitution on the triphenylamine may be achieved either by use of a vinyl substituted iodobenzene or vinyl substituted biphenyl in the above reaction, or by substitution of a vacant site on the triphenylamine, or by transformation of another functional group.

An advantageous approach to the synthesis of vinyltriphenylamine monomers uses the coupling of 4-iodo bromobenzene with an optionally substituted diphenylamine in the presence of finely divided copper. The resulting bromo triphenylamine is converted to a Grignard derivative by treatment with magnesium metal in tetrahydofuran, and reacted with vinyl bromide to yield the desired product. Other approaches to the synthesis of vinyltriphenylamines will be evident to those skilled in the art, and may be used with advantage according to the particular nature and pattern of substitution which is desired.

Polymerisation of the various monomers to form the copolymer of structure 1 may be accomplished by known means of ionic or free radical polymerisation and may be carried out via thermal or photochemical initiation.

A further aspect of this invention includes a statistical copolymer obtainable by the polymerisation of hole transporting groups of general Formula II and electron transporting groups of general Formula III such that the hole transporting groups and electron transporting groups are statistically distributed along the polymer chain and the degree of polymerisation of the statistical copolymer is 10–50000.

According to a further aspect of this invention an organic semiconductor device comprises a substrate bearing an organic layer sandwiched between electrode structures wherein the organic layer comprises a statistical copolymer given by general Formula I or any of the preferred embodiments of general Formula I.

It may also be the case that the organic layer further comprises another or a plurality of other organic semiconductor materials, including Hole Transport and/or Electron Transport materials.

The organic layer may further comprise a light emitter which may also be referred to as a luminescent material.

Preferably the light emitter is given by any of the following:

A luminescent dye of the coumarin type with a quantum efficiency of photoluminescence of 0.6 or greater A boron difluoride/pyromethene dye of the general-type described by L R Morgan and J H Boyer in U.S. Pat. No. 5,446,157

A luminescent condensed aromatic hydrocarbon such as coronene, rubrene, diphenyl anthracene, decacyclene, fluorene, perylene etc., and luminescent derivatives of such compounds including esters and imides of perylene, cyanated fluorene derivatives etc.

A luminescent chelate of a metal including europium, samarium, terbium, ruthenium chelates.

Preferably the organic semiconductor device is an organic light emitting diode device.

Preferably at least one of the electrodes is transparent to light of the emission wavelength of the organic layer. The other electrode may be a metal, for example Sm, Mg, U, Ag, Ca, Al or an alloy of metals, for example MgAg, LiAl or a double metal layer, for example Li and Al or Indium Tin Oxide (ITO). One or both electrodes may consist of organic conducting layers.

The invention will now be described with reference to the following diagrams by way of example only:

Figure 9:
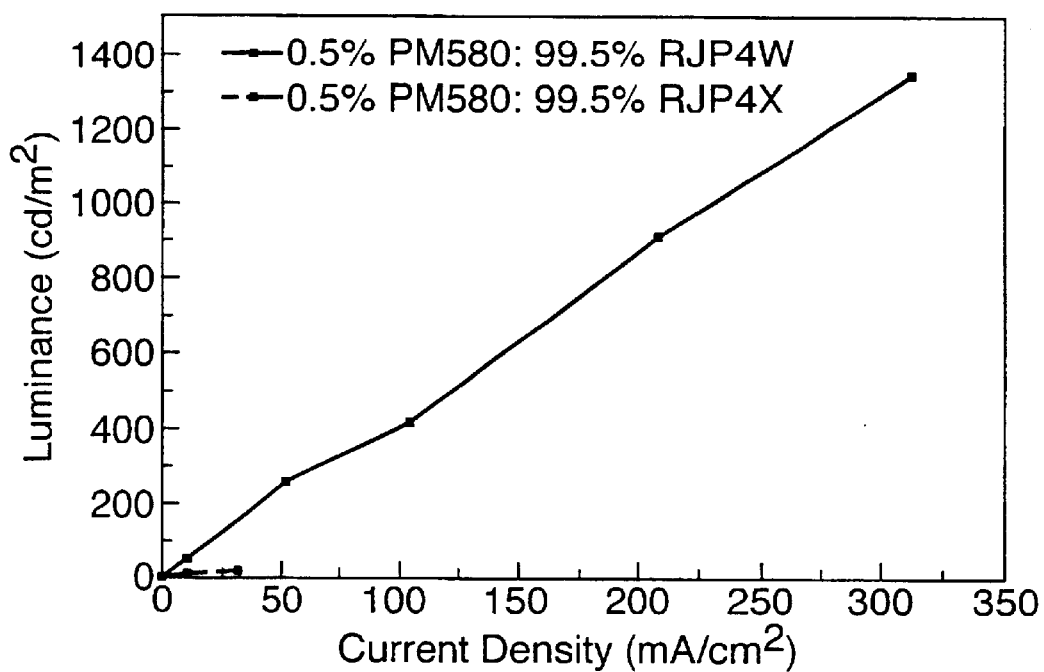

FIG. 9 shows luminance versus current density measured for a statistical copolymer comprising 0.5% PM580, 99.5% RJP4W—Film thickness 122.8 nm; compared against 0.5% PM580, 99.5% RJP4X fabricated in a device according to the present invention. Film thickness 111.6 nm.

Figure 10:
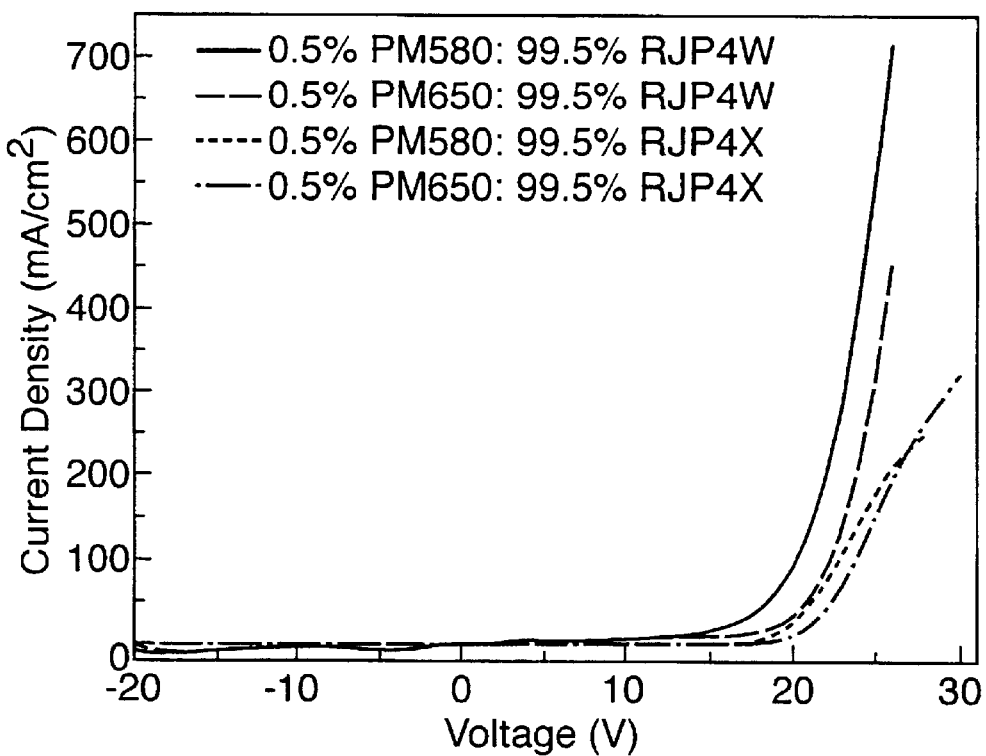

FIG. 10 shows current density versus voltage measured for a statistical copolymer comprising 0.5% PM580, 99.5% RJP4W—Film thickness 122.8 nm; compared against 0.5% PM580, 99.5% RJP4X all 5% solution in dichlorobenzene fabricated in a device according to the present invention. Film thickness 111.6 nm and for a statistical copolymer comprising 0.5% PM650, 99.5% RJP4W—Film thickness 123.8 nm; compared against 0.5% PM650, 99.5% RJP4X fabricated in a device according to the present invention. Film thickness 124.9 nm.

Figure 11:
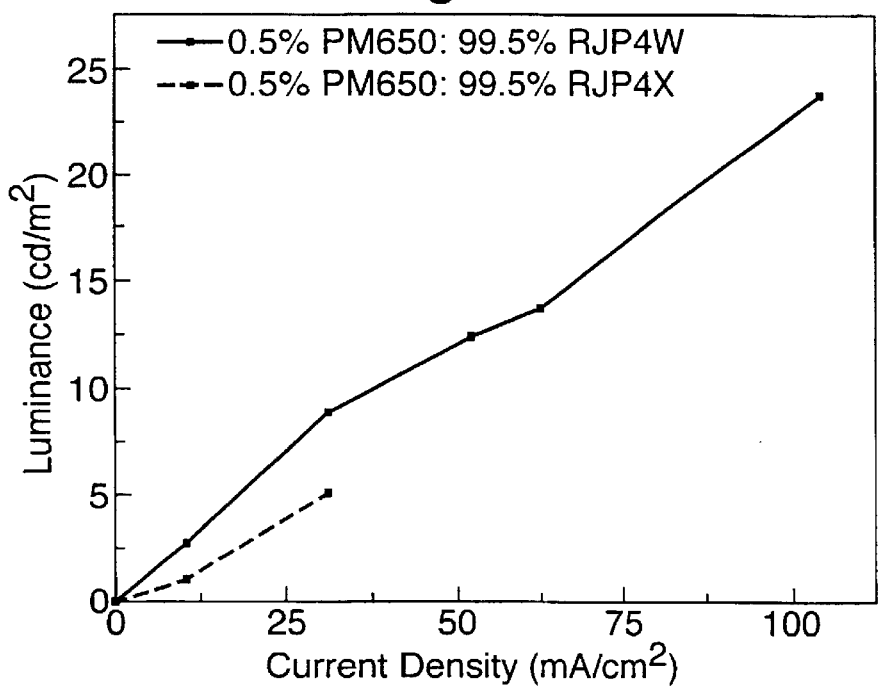

FIG. 11 shows luminance versus current density measured for a statistical copolymer comprising 0.5% PM650, 99.5% RIP4W—Film thickness 123.8 nm; compared against 0.5% PM650, 99.5% RJP4X fabricated in a device according to the present invention. Film thickness 124.9 nm.

Figure 12:
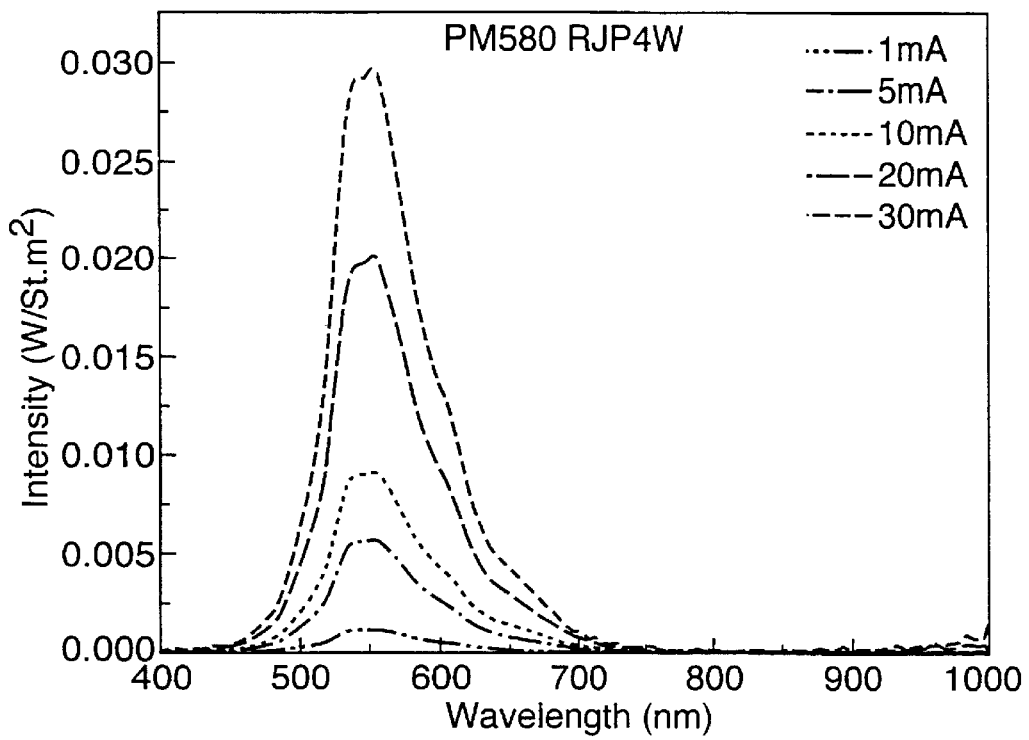

FIG. 12 shows emission spectra for sample comprising PM580 emitter and copolymer RIP4W.

Figure 13:
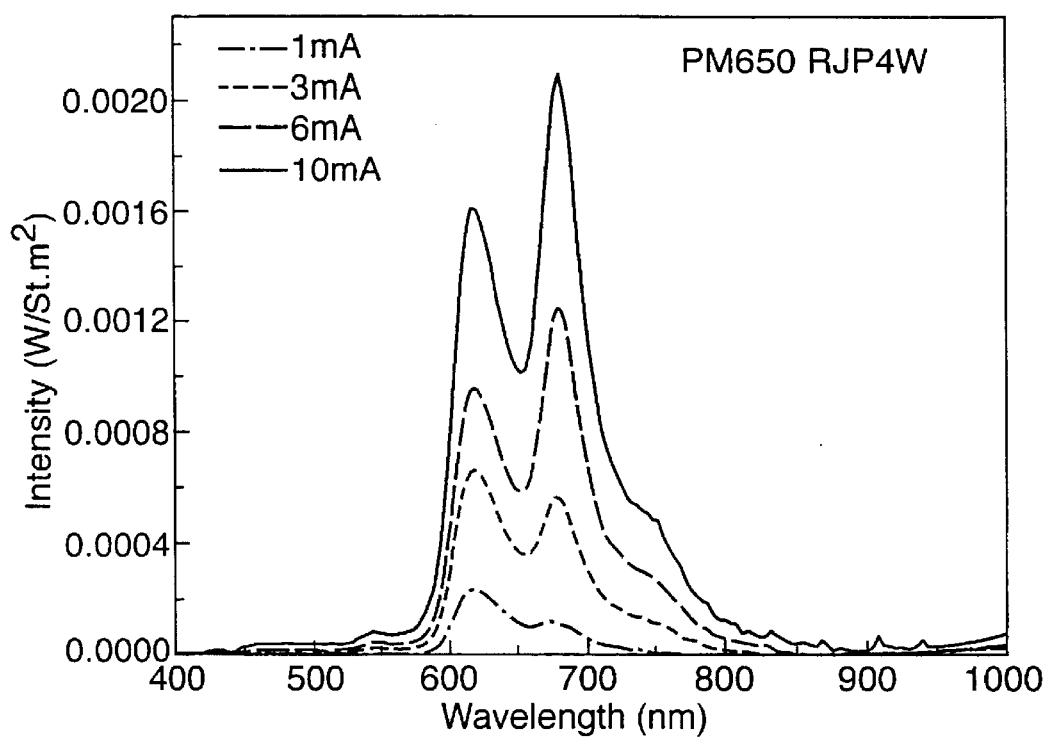

FIG. 13 shows emission spectra for sample comprising PM650 emitter and copolymer RIP4W.

Figure 14:
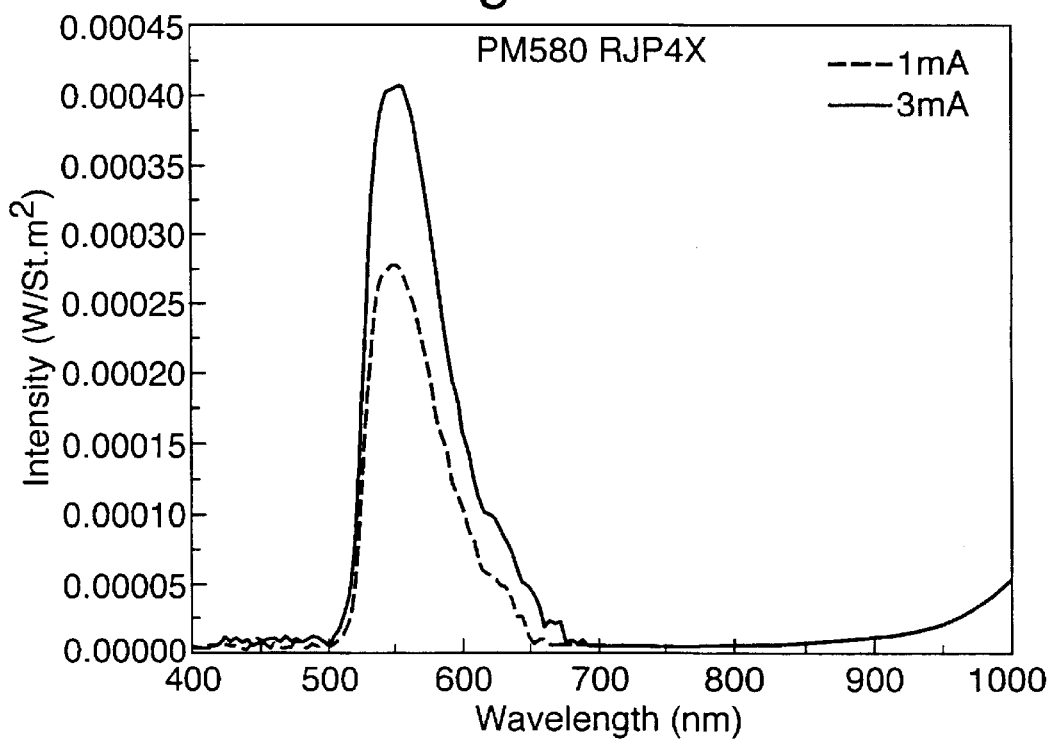

FIG. 14 shows emission spectra from sample comprising PM580 emitter and blend RJP4X.

Figure 15:
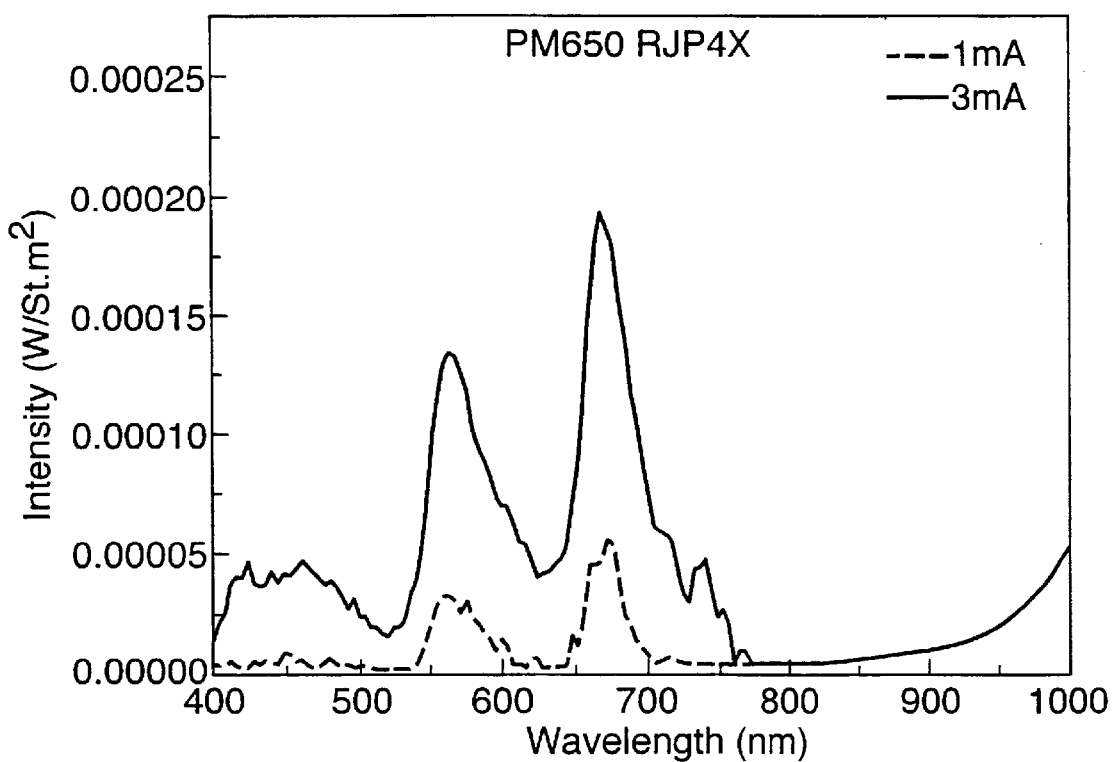

FIG. 15 shows emission spectra from sample comprising PM650 emitter and blend RJP4X.

Unless otherwise stated all reagents used are commercially available from the Aldrich Chemical Company.

Emitters PM650 and PM580 were obtained from AG Electro-Optics, Farside House, Tarporley Business Centre, Tarporley, Cheshire.

Figure 3:
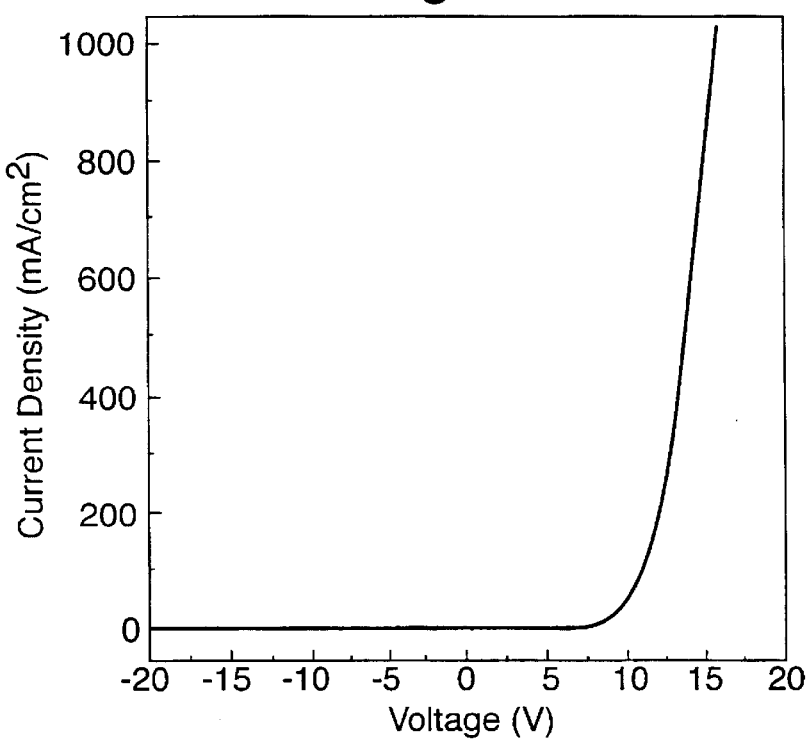
FIG. 3 illustrates current/voltage characteristics for a statistical copolymer comprising 0.5% PM580, 99.5% RJP5P used in an OLED device. Film thickness 74.2 nm.
Figure 4:
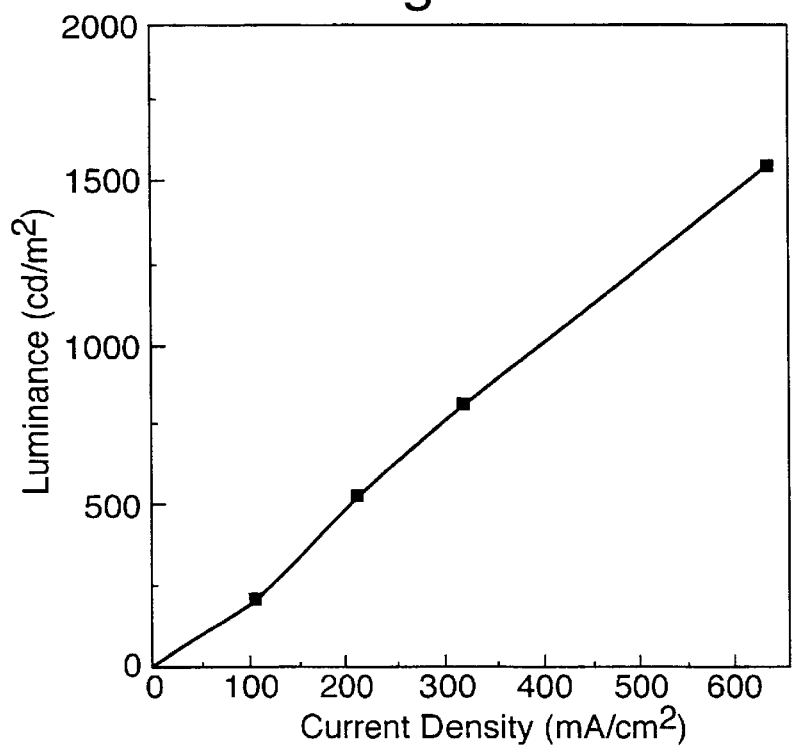
FIG. 4 shows the luminance versus current density measured for a statistical copolymer comprising 0.5% PM580, 99.5% RJP5P fabricated in a device according to the present invention. Film thickness 74.2 nm.
Figure 5:
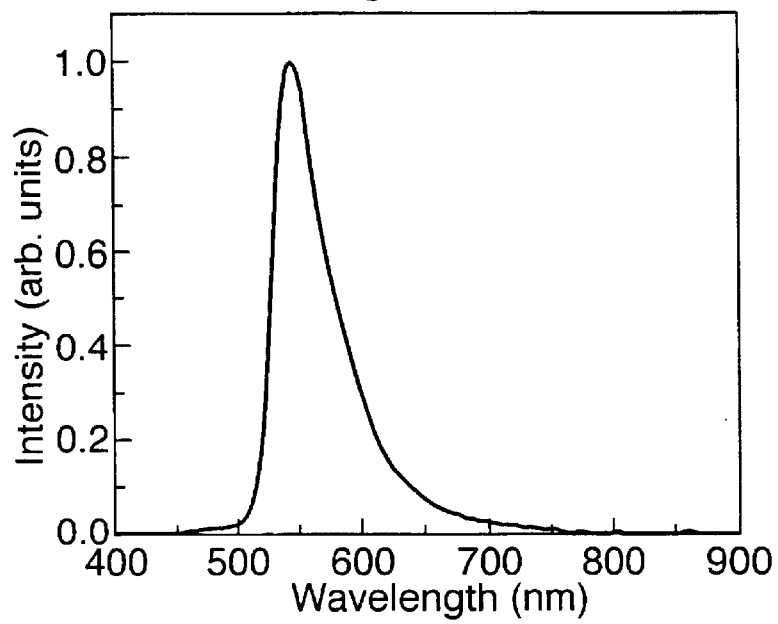
FIG. 5 shows the intensity versus wavelength measured for a statistical copolymer comprising 0.5% PM580, 99.5% RJP5P fabricated in a device according to the present invention. Film thickness 74.2 nm.
Figure 6:
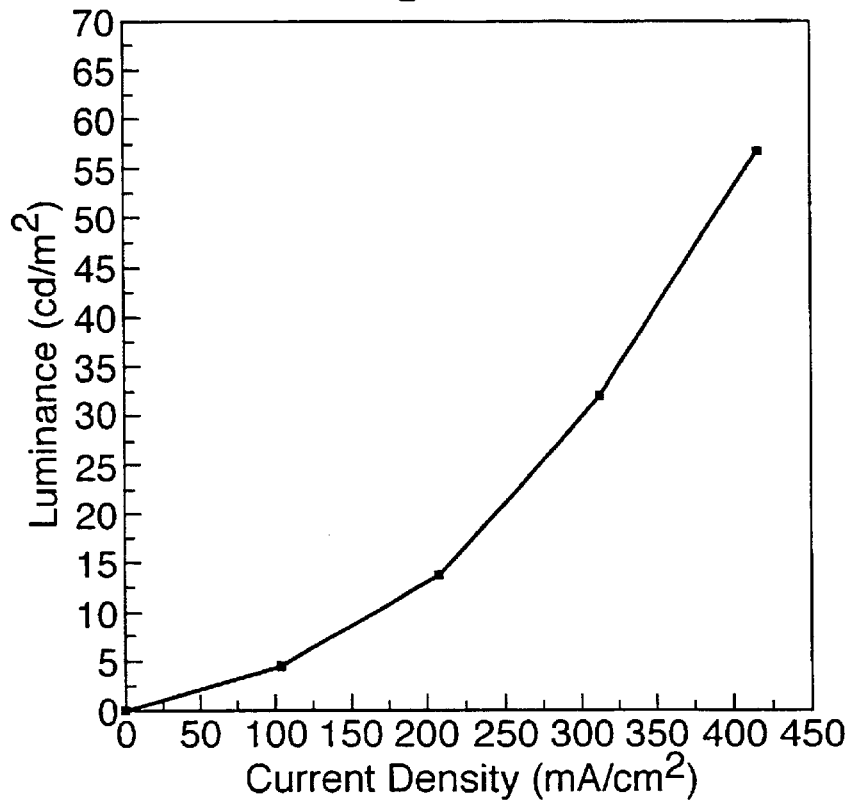
FIG. 6 shows the luminance versus current density measured for a statistical copolymer comprising 0.5% PM650, 99.5% RIP5P fabricated in a device according to the present invention. Film thickness 76 nm.
Figure 7:
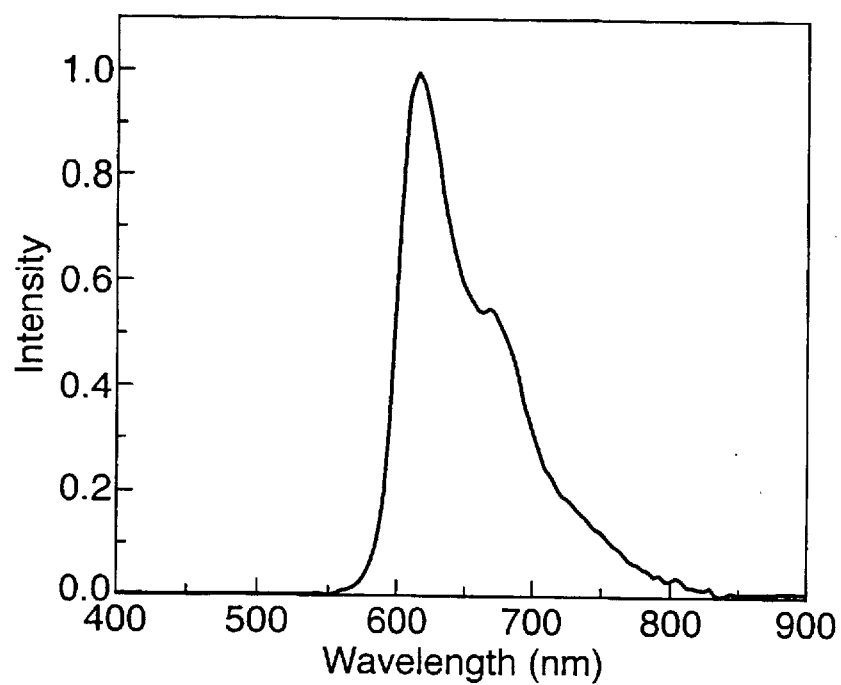
FIG. 7 shows the intensity versus wavelength measured for a statistical copolymer comprising 0.5% PM650, 99.5% RJP5P fabricated in a device according to the present invention. Film thickness 76 nm.
Figure 8:
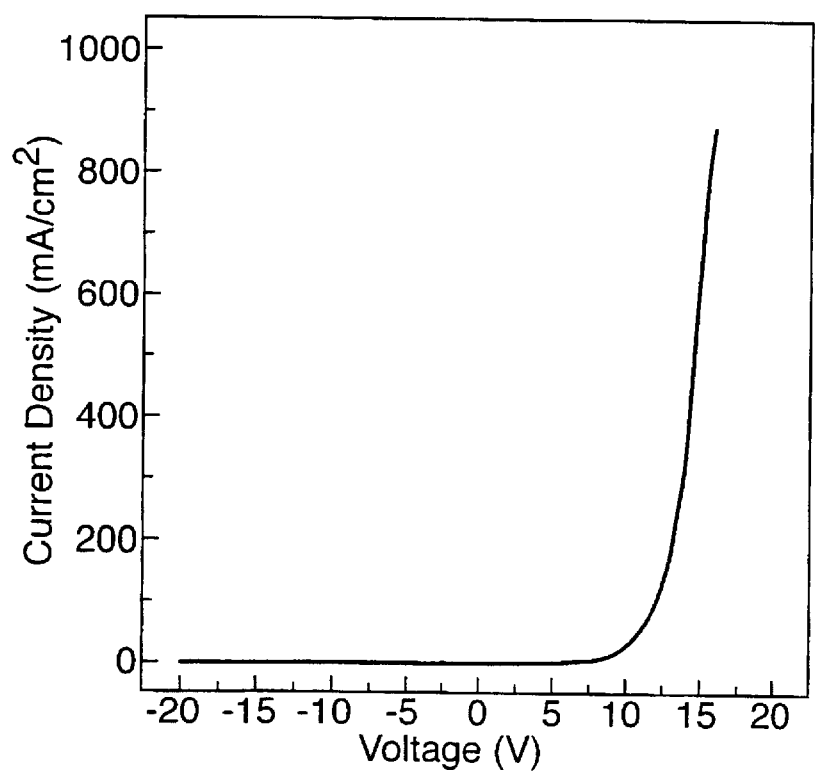
FIG. 8 illustrates current/voltage characteristics for a statistical copolymer comprising 0.5% PM650, 99.5% RJP5P used in an OLED device. Film thickness 76 nm.

The data shown in FIGS. 3, 6 and 10 was obtained using a computer controlled Keithley 236 Source Measure Unit.

The data shown in FIGS. 4,5,7,8,9,11,12,13,14,15 was obtained using a Photoresearch PR714 fast spectral scanning SpectraRadiometer.

The following compounds are illustrative examples which have been synthesised according to the present invention:

EXAMPLE 1

Synthesis of 4-Acyl-triphenylamine

4-Acyl-triphenylamine was prepared by the acylation of triphenylamine using acetyl chloride and anhydrous zinc chloride as catalyst according to a previously published procedure- see C J Fox and A L Johnson, J. Org. Chem., 1964, 29, 3536.

Synthesis of 4-Vinyl-triphenylamine

4-Acyl-triphenylamine (31.6 g, 0.110 mol) and Al(O$^i$Pr)$_3$ (44.5, 0.220 mol) were suspended in xylene (100 ml) and refluxed for 3 hours. During this period nitrogen was passed through the reaction vessel and up the condenser to remove acetone produced during the reaction. The solution was cooled and poured into water producing a white precipitate of aluminium salts which were removed by filtration. The layers were separated, the aqueous layer washed with diethyl ether (2×150 ml), the organic extracts combined, dried over MgSO$_4$, and solvent removed in vacuo to give a yellow solid. This solid was recrystallised from hexane (100 ml) cooled to −78° C. to yield a white solid which was collected by filtration and dried in vacuo (15.3 g, 0.056 mol, 51%).

$^1$H NMR (200 MHz, CDCl$_3$)

d 7.4–6.8 (m, 20H, aromatic C$\underline{H}$), 6.67 (d of d, $^3J_{HH}$ 10.8 and 17.58 Hz, ArC$\underline{H}$CH$_2$), 5.65 (d, $^3J_{HH}$ 17.58 Hz, ArCHC$\underline{H}_2$ (trans)), 5.17, (d, $^3J_{HH}$ 10.9 Hz, ArCHC$\underline{H}_2$(cis));

Elemental Analysis: C 88.43%, H 6.39%, N 5.16% (C$_{20}$H$_{17}$N requires C 88.52%, H 6.32%, N 5.10%).

Melting Point: 87.5–89° C.

Purification of Monomer

4-Vinyl-triphenylamine was purified by column chromatography on silica with hexane as an eluant. The solvent was removed and redissolved in sufficient degassed pentane just to dissolve the solid. The solution was stirred over activated charcoal and filtered under nitrogen. It was then stirred over calcium hydride and filtered under nitrogen, and finally stirred over silica and filtered under nitrogen. It was then cooled to −25° C. and the white solid thus formed collected by filtration under nitrogen and dried under high vacuum for 7 days. From this point on the solid was handled in a nitrogen filled dry box.

EXAMPLE 2

Synthesis of Oxadiazole Monomers

Synthesis of 2-(4-Vinylphenyl)-5-Phenyloxadiazole 2-(4-Bromophenyl)-5-phenyl-oxadiazole (2.0 g, 6.64 mmol) was dissolved in degassed toluene (30 ml). Pd(PPh$_3$)$_4$ (0.15 g, 0.133 mmol) and $^n$Bu$_3$Sn(CHCH$_2$)(2.11 g, 6.64 mmol) were added under dry nitrogen. The solution was refluxed for 4 hours, cooled, and evaporated to give a yellow solid. This solid was dissolved in toluene (20 ml), silica added (20 g) and the solvent removed in vacuo. This solid was placed on top of a short column of silica and flushed with hexane to remove $^n$Bu$_3$SnBr, and the column then stripped with methanol. The methanol was evaporated, and the residue recrystallised from hexane to give white crystals of 2-(4-vinylphenyl)-5-phenyloxadiazole, (m.pt. 83–84° C., lit.[ii] 82–84° C.)1.1 g, 67%. $^1$H NMR (CDCl$_3$, 300 MHz) δ 8.1–8.0 (m, 4H, aromatic C$\underline{H}$), 7.6–7.6 (m,5H, aromatic C$\underline{H}$), 6.77 (d of d, $^3J_{HH}$ 17.4 Hz and 10.8 Hz, ChC$\underline{H}_2$), 6.90 (d, $^3J_{HH}$ 17.4 Hz, CHC$\underline{H}_2$), (d of d, $^3J_{HH}$ 10.8 Hz, CHC$\underline{H}_2$).

Synthesis of 2-(3-Vinylphenyl)-5-phenyloxadiazole 2-(4-Bromophenyl)-5-phenyl-oxadiazole[iii] (2.0 g, 6.64 mmol) was dissolved in degassed toluene (30 ml). Pd(PPh$_3$)$_4$ (0.15 g, 0.133 mmol) and $^n$Bu$_3$Sn(CHCH$_2$)(2.11 g, 6.64 mmol) were added under dry nitrogen. The solution was refluxed for 4 hours, cooled, and evaporated to give a yellow solid. This solid was dissolved in toluene (20 ml), silica added (20 g) and the solvent removed in vacuo. This solid was placed on top of a short column of silica and flushed with hexane to remove $^n$Bu$_3$SnBr, and the column then stripped with methanol. The methanol was evaporated, and the residue recrystallised from hexane to give white crystals of 2-(3-vinylphenyl)-5-phenyloxadiazole, 0.90g, 54% (m.pt. 75–76° C.). Found: C,; H,; N, %; C$_{16}$H$_{12}$N$_2$O requires C, 77.40; H, 4.87; N, 11.28%. $^1$H NMR (CDCl$_3$, 300 MHz): δ 8.1–8.2 (m, 3H, aromatic C$\underline{H}$), 8.02 (d of t, 1H, aromatic C$\underline{H}$), 7.6–7.4 (m, 5H, aromatic C$\underline{H}$), 6.80 (d of d, $^3J_{HH}$ 17.7 Hz and 10.8 Hz, C$\underline{H}$CH$_2$), 6.90 (d, $^3J_{HH}$ 17.7 Hz, CHC$\underline{H}_2$), 5.39 (d of d, $^3J_{HH}$ 0.8 Hz, CHC$\underline{H}_2$).

EXAMPLE 3

Synthesis of 6-Vinyl-2.3-diphenylquinoxaline

Synthesis of 6-Methyl-2.3-diphenylquinoxaline 1,2-Diamino-4-methylbenzene (25.0 g, 0.20 mol) and benzil (43 g, 0.20 mol) were refluxed in ethanoic acid (250 ml) overnight. The solvent was evaporated in vacuo and the black residue recrystallised three times from ethanol to give pale brown crystals of 6-methyl-2,3-diphenylquinoxaline, 39.6 g, 65% (m.pt. 114.5–116° C. (lit.[iv] 115–116° C.)). $^1$H NMR (CDCl$_3$, 300 MHz) δ 8.08 (d, J 8.4 Hz, 1H, Hs of quinoxaline), 7.97 (bs, 1H, Hs of quinoxaline), 7.60 (d of d, J 8.4 Hz, J 1.8 Hz, 1H, Hs of quinoxaline), 7.50–7.58 (m, 4H, phenyl rings), 7.30–7.38 (m, 6H, phenyl rings), 2.62 (s, 3H, Ch$_3$).

Synthesis of 6-Bromomethyl-2,3-diphenylquinoxaline

6-Methyl-2,3-diphenylquinoxaline (5.0 g, 16.9 mmol) was dissolved in dry, oxygen free benzene (50 ml). The solution was brought to reflux and a mixture of NBS (3.00 g, 16.9 mmol) and AIBN (0.1 g) added as a solid over a period of 30 minutes. The solution was then refluxed for 2 hrs, cooled, washed with water (3×100 ml), dried over MgSO$_4$ and evaporated to leave a pale brown solid. This was recrystallised from hexane/toluene (1:1, 80 ml) to yield 6-bromomethyl-2,3-diphenylquinoxaline, 3.5 g, 56%. Traces of 6-methyl-2,3-diphenylquinoxaline were shown to be present by $^1$H NMR. A small sample was recrystallised from acetone for characterisation (m.pt. 146–148° C.). Found: C,; H,; N, %; C$_{21}$H$_{15}$N$_2$Br requires C, 67.21; H, 4.03; N, 7.47%. $^1$H NMR (CDCl$_3$, 300 MHz) δ 8.16 (d, J 8.7 Hz, 1H, Hs of quinoxaline), 8.16 (d, J 2.2 Hz, 1H, Hs of quinoxaline), 7.78 (d of d, J 8.7 Hz, J 2.2 Hz, 1H, Hs of quinoxaline), 7.48–7.56 (m, 4H, phenyl ring), 7.30–7.40 (m, 6H, phenyl ring), 4.71 (s, 2H, CH$_2$Br).

Synthesis of Triphenyl(diphenylquinoxaline) phosphonium Bromide

6-Bromomethyl-2,3-diphenylquinoxaline (10 g, 2.7 mmol) and triphenylphosphine (0.70 g, 2.7 mmol) were dissolved in toluene (50 ml) and the solution refluxed overnight. The white solid that precipitated was recovered by filtration and dried in vacuo to give triphenyl (diphenylquinoxaline)phosphonium bromide (1.58 g, 93%). $^1$H NMR (CDCl$_3$, 300 MHz) δ 7.1–7.8 (m, 29H, aromatic Hs), 5.82 (d, $^2J_{HP}$ 13 Hz, 2H, CH$_2$P). Found: C,; H,; N, %; C$_{39}$H$_{30}$N$_2$PBr requires C, 73.47; H, 4.74; N, 4.39%.

Melting point: decomposes around 200° C.

Synthesis of 6-Vinyl-2,3-Diphenylquinoxaline

Triphenyl(diphenylquinoxaline)phosphonium bromide (44.0 g, 69mmol) was dissolved in dichloromethane (100 ml) and formaldehyde (10 ml, 37% solution in water, 118 mmol) added. Aqueous sodium hydroxide (50 ml, 50% solution) was added dropwise of a period of 30 minutes with rapid stirring and stirred for a further 30 minutes. The solution was diluted with dichloromethane, washed with water, dried over MgSO$_4$ and evaporated to dryness to give a pale yellow solid. This solid was purified by column chromatography on silica with hexane as the eluent to give white crystals, 10.5 g, 50% (m.pt. 122–123° C., lit.[v] 122–123° C.). Found: C,; H,; N, %; C$_{22}$H$_{16}$N$_2$ requires C, 85.69; H, 5.23; N, 9.08% $^1$H NMR (CDCl$_3$, 300 MHz) δ 8.11 (d, $^3J_{HH}$ 8.7 Hz, 1H, quinoxaline H), 8.10 (br, 1H, quinoxaline H), 7.90 (d of d, $^3J_{HH}$ 8.7 Hz, $^4J_{HH}$ 2.1 Hz, quinoxaline H), 7.45–7.55 (m, 4H, phenyl H), 7.28–7.38 (m, 6H, phenyl H), 6.95 (d of d, $^3J_{HH}$(cis) 11.1 Hz, $^3J_{HH}$(trans) 17.7 Hz, 1H, vinylic H), 6.00 (d, $^3J_{HH}$(trans) 17.7 Hz, 1H, vinylic H), 5.47 (d, $^3J_{HH}$(CiS) 11.1 Hz 1H, vinylic H).

Free Radical Copolymerisation

PDI is the Poly Dispersity Index and=$\overline{M}_w/\overline{M}_n$ (RJP5P): Copolymerisation of 4-Vinyl-triphenylamine and 6-Vinyl-2.3-diphenylquinoxaline 1,2-Diphenyl-6-vinylquinoxaline (0.60 g), 4-vinyltriphenylamine (0.60 g) and AIBN (19.71 mg, 120

μmol) were placed in an ampoule and benzene (8 ml) condensed into the ampoule under vacuum. The solution was then heated in the ampoule to 70° C. for 10 hours, cooled and the product poured into methanol (50 ml). The polymer which precipitated was collected by filtration and dried under vacuum to yield 0.82 g of a white powder.

(RJP4W): Copolymerisation of 4-Vinyl-triphenylamine and 2-Phenyl-5-(3'-vinylphenyl)-1,3,4-oxadiazole 2-phenyl-5-(3'-vinylphenyl)-1,3,4oxadiazole (0.60 g), 4-vinyltriphenylamine (0.60 g) and AIBN (19.71 mg, 120 μmol) were placed in an ampoule and benzene (5 ml) condensed into the ampoule under vacuum. The solution was then heated in the ampoule to 70° C. for 10 hours, cooled and the product poured into methanol (50 ml). The polymer which precipitated was collected by filtration and dried under vacuum to yield 0.80 g of a white powder.

GPC analysis (CHCl$_3$): $\overline{M}_n$ 15,700, $\overline{M}_w$ 53,000, $\overline{M}_w/\overline{M}_n$ 3.4

For comparison purposes only, the following example is for the preparation of a polymer blend:

(RJP 4X): Preparation of Polymer Blend of Poly(2-phenyl-5-(3'-vinylphenyl)-1,3,4-oxadiazole) and Poly(4-vinyltriphenylamine)

Poly(2-phenyl-5-(3'-vinylphenyl)-1,3,4-oxadiazole) (0.40 g, RJP4V) and poly(4-vinyltriphenylamine) (0.40 g RJP4U) were dissolved in 10 ml of dichloromethane, stirred overnight, filtered through a 0.2 μm filter into methanol (100 ml). The polymer which precipitated was collected by filtration and dried under vacuum to yield 0.70 g of a white powder.

[i] T. F. Osipova, G. I. Koldobskii, V. A. Ostrovskii, J. Org. Chem. USSR (Engl. Transl.), 20, 1984, 2248.

[ii] V. I. Grigor'eva, R. S. Mil'ner, Chem. Heterocycl. Compd. (Engl. Transl.), 4, 1968, 18.

[iii] T. F. Osipova, G. I. Koldobskii, V. A. Ostrovskii, J. Org. Chem. USSR (Engl. Transl.), 20, 1984, 2248.

[iv] Braun, Quarg, *Angew. Makromol. Chem.*, 1975, 43, 125

[v] G. Manecke, U. Rotter, Makromol. Chem. 171, 1973, 49

Figure 1:
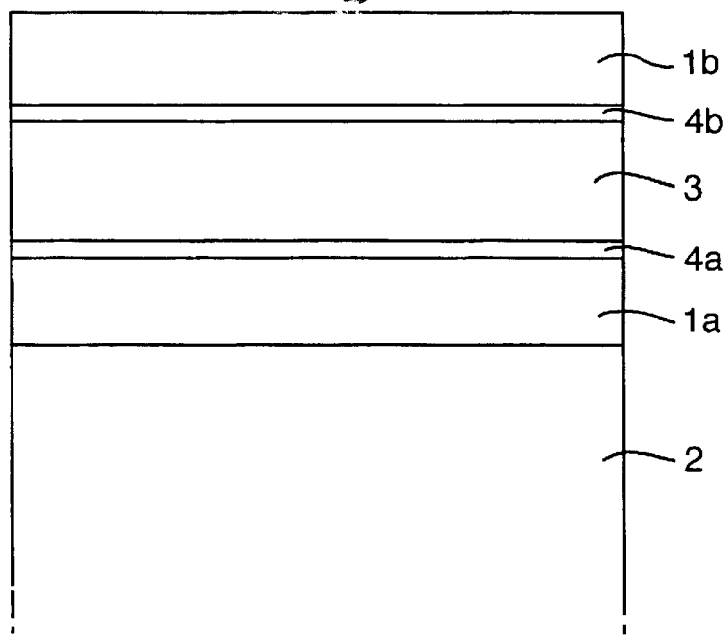
FIG. 1 illustrates an Organic Light Emitting Diode (OLED) device incorporating the materials of the present invention.

The materials described by the current invention may be used in a variety of devices. By way of example an Organic Light Emitting Diode (OLED), which is a type of semiconductor device, suitable for incorporating materials of the present invention is illustrated in FIG. 1. The device comprises two electrodes 1a, 1b, at least one of the electrodes is transparent to light of the emission wavelength of a layer of organic material 3. The other electrode may be a metal, for example Samarium (Sm), Mg, Li, Ca, Al or an alloy of metals, for example MgAg, LiAl or a double metal layer, for example Li and Al or Indium Tin Oxide (ITO). One or both electrodes 1a, 1b may consist of organic conducting layers. A processing surface or substrates 2 may be made of any material which is flat enough to allow subsequent processing, for example glass, silicon, plastic. The substrate 2 may be transparent to the emitted radiation of the organic material 3. Alternatively one of the electrodes 1a, 1b may be transparent instead. Sandwiched between the electrodes 1a and 1b is a layer of organic material 3. The layer of organic material 3 possesses the following three properties: electron transporting (ET); hole transporting (HT); light emitting (LE).

In the present invention the layer of organic material 3 comprises a material given by Formula I and optionally there may be present a separate light emitter. When a separate light emitter is not present then either the hole transporter and or the electron transporter group may function additionally as a light emitter.

Preferably the luminescent material i.e. the light emitter has a high quantum efficiency of luminescence.

Preferably the light emitter is given by any of the following:

A luminescent dye of the coumarin type with a quantum efficiency of photoluminescence of 0.6 or greater A boron difluoride/pyromethene dye of the general type described by L R Morgan and J H Boyer in U.S. Pat. No. 5,446,157

A luminescent condensed aromatic hydrocarbon such as coronene, rubrene, diphenyl anthracene, decacyclene, fluorene, perylene etc., and luminescent derivatives of such compounds including esters and imides of perylene, cyanated fluorene derivatives etc.

A luminescent chelate of a metal including europium, samarium, terbium, ruthenium chelates.

The layer of organic material 3 may be deposited on the electrode 1a by any of the following techniques: thermal evaporation under vacuum, sputtering, chemical vapour deposition, spin depositing from solution or other conventional thin film technology. The thickness of the layer of organic material 3 is typically 30–2000 nm, preferably 50–500 nm. The device may contain layers 4a and 4b which are situated next to the electrodes 1a and 1b, these layers 4a and 4b may be conducting or insulating and act as a barrier to diffusion of the electrode material or as a barrier to chemical reaction at the electrode 1a, 1b and layer of organic material 3 interface. Examples of suitable materials for 4a and 4b include emeraldine which prevents indium diffusion into the layer of organic material 3 from an ITO electrode, or, for the same reason, copper phthalocyanine may be used; alternatively the addition of a thin layer (~0.5 nm) of lithium or magnesium fluoride at the interface between a lithium electrode and the layer of organic material 3 may be used.

Figure 2:
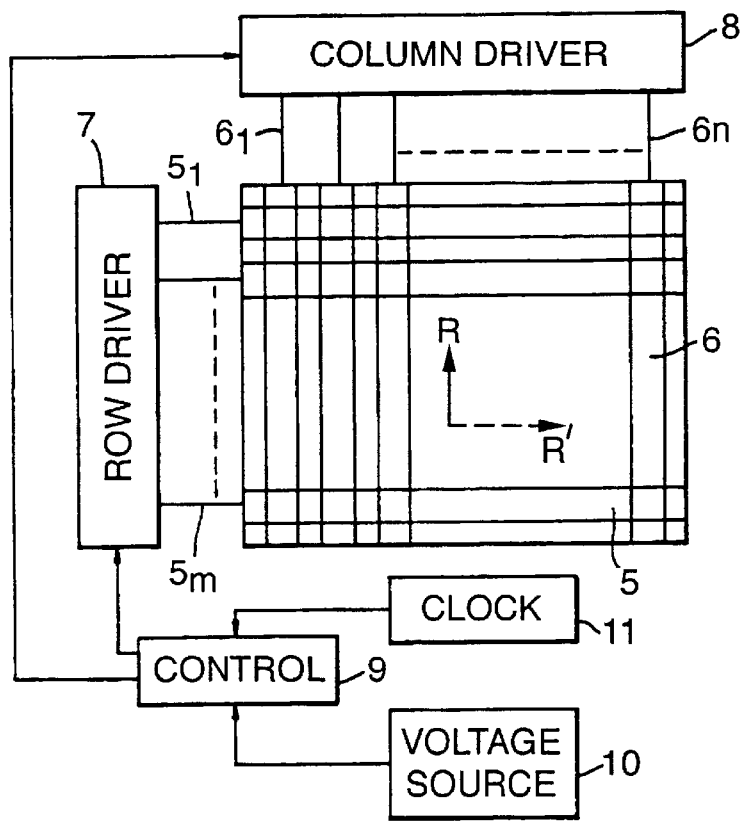
FIG. 2 is a plan view of a matrix multiplex addressed device of FIG. 1.

The device of FIG. 1 may be a singe pixel device or it may be matrix addressed. An example of a matrix addressed OLED is shown in plan view in FIG. 2. The display of FIG. 2 has the internal structure described in FIG. 1 but the substrate electrode 5 is split into strip-like rows 5*l* to 5*m* and similar column electrodes 6*l* to 6*n*, this forms an mxn matrix of addressable elements or pixels. Each pixel is formed by the intersection of a row and column electrode.

A row driver 7 supplies voltage to each row electrode 5. Similarly, a column driver 8 supplies voltage to each column electrode. Control of applied voltages is from a control logic 9 which receives power from a voltage source 10 and timing from a clock 11.

The following illustrates, by way of example only, a method of device fabrication incorporating the material prepared in Example 1.

Example of Device Fabrication 4.5% by weight of a mixture of the polymer (99.5%) produced by the copolymerisation of Examples 1 and 3 in combination with emitter PM580(0.5%) was dissolved in dichlorobenzene. The solution was deposited on to an indium tin oxide coated glass substrate which was then spun at 3000 rpm for 30 s. The substrate was removed from the spinner and placed on a hotplate at 75° C. for 10 mins to drive off the residual solvent. A uniform polymer film was deposited by this means. On to the uniform polymer layer, a cathode comprising 100 nm layer of magnesium and a 100 nm layer of silver was deposited by thermal evaporation.

The film thickness obtained was 74.2 nm. The layer of silver cathode may be deposited by thermal evaporation under high vacuum through an evaporation mask. The mask was patterned with a series of 3.5 mm diameter circular holes, resulting in an array of circular electrode pads deposited on the organic layers. The sample was removed from the vacuum chamber and electrical connections were made using indium solder to contact to the ITO and a copper wire to contact the silver pads. Each device defined by the area of metallisation of one silver pad was found to function both as a rectifier and as a light emitting diode.

Further examples include:

(0.5% PM580: 99.5% RIP4W) 5% soln in Dichlorobenzene film thickness 124.9 nm (0.5% PM580: 99.5% RJP4X) 5% soln in Dichlorobenzene film thickness 111.6 nm (0.5% PM650: 99.5% RJP4W) 5% soln in Dichlorobenzene film thickness 123.8 nm (0.5% PM650: 99.5% RJP4X) 5% soln in Dichlorobenzene film thickness 122.8 nm All samples were spin coated on ITO coated glass at 200 rpm all other process conditions were as already described.

RJP4X is a polymer blend and is present for comparative reasons only.

In FIG. 11 though the gradients are quite similar, the devices made from polymer blend RJP4X all failed because they could not carry the same current as those made with the copolymer.

In FIG. 15 when, compared to FIG. 13 it is evident there is a large difference suggesting that phase separation is occurring for the polymer blend—the data suggests that the emitting species for the blend has a different environment.

The compounds of the present invention may also be used in photosensitive devices for example photodiodes, photovoltaic cells, sensitive layers for electrophotography and photorefractive layers.

In the case where the conducting polymers of the current invention may be used as components of optical storage and switching equipment by use of the photorefractive effect then with reference to FIG. 1, the layer 3 comprises a layer of organic material having conductive, photogenerative and electro-optic properties. Such properties may be obtained by addition of suitable dopants to a conducting polymer as described by the present invention. Suitable dopants for inducing the capability for photogeneration of charge include $C_{60}$ fullerene. Suitable dopants to provide a linear electro-optic coefficient include dimethylamino nitrostilbene.

What is claimed is:

1. Statistical copolymers of general Formula I:

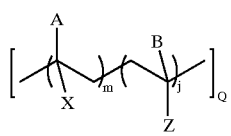

Formula I wherein m and j are the average number of repeat units of A and B such that:

m=0.1–0.9, j=1–m,

Q=10–50000;

A and B represent respectively hole transporting groups and electron transporting groups, such groups being statistically distributed along the polymer chain; X and Z are independently selected from H, CN, F, Cl, Br, and $CO_2CH_3$.

2. A statistical copolymer according to claim 1 wherein the electron transporting and hole transporting groups are directly attached to the polymer backbone such that there is a direct bond between an aromatic part of the electron transporting group and the polymer backbone and a direct bond between the hole transporting group and the polymer backbone.

3. A statistical copolymer according to either of claims 1 or 2 wherein the hole transporting group is given by the following general Formula II:

Formula II where $Ar_1$ is connected to the polymer backbone and is selected from 1,2-phenylene, 1,3-phenylene, 1,4-phenylene, 4,4'-biphenylene, 1,4-naphthylene and 2,6-naphthylene, and C and D are independently selected from groups of structure $Ar_2$, where $Ar_2$ is selected from phenyl, biphenyl, 1-naphthyl and 2-naphthyl, and $Ar_2$ is optionally substituted with one or two groups independently selected from OR, NRR', and $N(Ar_3)_2$, where R and R' denote $C_1$ to $C_6$ alkyl groups and $Ar_3$ is selected from phenyl, biphenyl, 1-naphthyl and 2-naphthyl and $Ar_3$ may be optionally substituted with one or two groups independently selected from OR, $N(Ar_3)_2$ and NRR'.

4. A statistical copolymer according to claim 3 wherein Formula II is given by one of the following:

N, N-diphenyl-4-aminophenyl 2-(N,N-diphenyl-6-amino)naphthyl

N,N-bis(4-dimethylaminophenyl)-4-amino phenyl

N-phenyl N-4-methoxyphenyl 4-aminophenyl

N-phenyl N-4-dimethylaminophenyl 4-aminophenyl

N-4-methylphenyl N-4-dimethylaminophenyl 4-aminophenyl

N-phenyl N-4-diphenylaminophenyl 4-aminophenyl

N,N-bis-4-diphenylaminophenyl 4-aminophenyl

N-phenyl, N(4,4'-N',N'-diphenylamino-biphenylyl) 4-aminophenyl

N-3-methylphenyl N-(4,4'-N'-phenyl-N'-3-methylphenyl aminobiphenylyl) 4-aminophenyl N-1-naphthyl, N-(4,4'-N'-phenyl-N'-1-naphthyl aminobiphenylyl) 4-aminophenyl.

5. A statistical copolymer according to claim 1 or claim 2 wherein the electron transporting group is given by the following general Formula III:

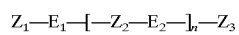

Formula III where $Z_1$ is connected to the polymer backbone and $E_1$ and $E_2$ are chosen from

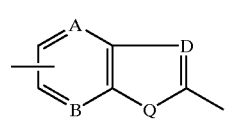

Formula IV and

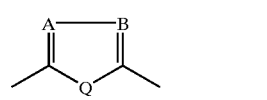

Formula V

-continued

Formula IV where F, G and H are independently chosen in each ring from CH and N, and Q is chosen in each ring from S, O, NR", CHR", CR"R", CH=CH, N=N, N=CH and N=CR", wherein $Z_1$ and $Z_2$ are single bonds or a group $Ar_4$ which is selected from 1,2-phenylene, 1,3-phenylene, 1,4-phenylene, 4,4'-biphenylene, 1,4-naphthylene and 2,6-naphthylene, $Z_3$ is a phenyl, naphthyl or biphenyl group optionally substituted in one or two positions with $C_1$ to $C_6$ alkyl, R" is chosen from $C_1$ to $C_6$ alkyl groups and aryl groups and n=0, 1 or 2.

6. A statistical copolymer according to claim 5 wherein the aryl groups are phenyl groups.

7. A statistical copolymer according to claim 5 wherein $E_1$ and $E_2$ in Formula III are selected from:

Oxazole

Oxadiazole

Benzoxazole

Benzthiazole

Quinoxaline

Thiadiazole 1,2,4-triazine

Phenylquinoxaline.

8. A statistical copolymer according to claim 5 wherein Formula III is selected from the following:

4-(5-phenyl-1,3,4-oxadiazolyl)phenyl 4-(5-(t-butylphenyl)-1,3,4-oxadiazolyl)phenyl 6-(2,3-diphenyl)quinoxalinyl 6-(2,3-dinaphthyl)quinoxalinyl 4-(5-(t-butyl phenyl)-1,3,4-oxadiazolyl)biphenylyl.

9. Statistical copolymers of general Formula I:

Formula I wherein m and j are the average number of repeat units of A and B such that:

m=0.1–0.9, j=1–m,

Q=10–50000;

X and Z are independently selected from H, CN, F, Cl, Br, and $CO_2CH_3$,

A and B are independently selected from hole transporting groups and electron transporting groups and are statistically distributed along the polymer chain wherein the hole transporting groups are given by Formula II:

Formula II where $Ar_1$ is connected to the polymer backbone and is selected from 1,2-phenylene, 1,3-phenylene, 1,4-phenylene, 4,4'-biphenylene, 1,4-naphthylene and 2,6-naphthylene, and C and D are independently selected from groups of structure $Ar_2$, where $Ar_2$ is selected from phenyl, biphenyl, 1-naphthyl and 2-naphthyl, and $Ar_2$ is optionally substituted with one or two groups independently selected from OR, NRR', and $N(Ar_3)_2$, where R and R' denote $C_1$ to $C_6$ alkyl groups and $Ar_3$ is selected from phenyl, biphenyl, 1-naphthyl and 2-naphthyl and $Ar_3$ is optionally substituted with one or two groups independently selected from OR, $N(Ar_3)_2$, and NRR';

and the electron transporting groups are given by Formula III:

$$Z_1-E_1-[-Z_2-E_2-]n-Z_3 \quad \text{Formula III}$$

where $Z_1$ is connected to the polymer backbone and $E_1$ and $E_2$ are chosen from Formula IV and Formula V Formula IV and Formula V where F, G and H are independently chosen in each ring from CH and N, and Q is chosen in each ring from S, O, NR", CHR", CR"R", CH=CH, N=N, N=CH and N=CR", wherein $Z_1$ and $Z_2$ are single bonds or a group $Ar_4$ which is selected from 1,2-phenylene, 1,3-phenylene, 1,4-phenylene, 4,4'-biphenylene, 1,4-naphthylene and 2,6-naphthylene, $Z_3$ is a phenyl, naphthyl or biphenyl group optionally substituted in one or two positions with $C_1$ to $C_6$ alkyl, R" is chosen from $C_1$ to $C_6$ alkyl groups and aryl groups and n=0, 1 or 2.

10. A statistical copolymer obtained by the polymerization of hole transporting groups of general Formula II Formula II where $Ar_1$ is connected to the polymer backbone and is selected from 1,2-phenylene, 1,3-phenylene, 1,4-phenylene, 4,4'-biphenylene, 1,4-naphthylene and 2,6-naphthylene, and C and D are independently selected from groups of structure $Ar_2$, where $Ar_2$ is selected from phenyl, biphenyl, 1-naphthyl and 2-naphthyl, and $Ar_2$ is optionally substituted with one or two groups independently selected from OR, NRR', and N(Ar$_3$)$_2$, where R and R' denote C$_1$ to C$_6$ alkyl groups and Ar$_3$ is selected from phenyl, biphenyl, 1-naphthyl and 2-naphthyl and Ar3 may be optionally substituted with one or two groups independently selected from OR, N(Ar$_3$)$_2$ and NRR';

and electron transporting groups of general Formula III

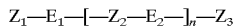
Formula III where Z$_1$ is connected to the polymer backbone and E$_1$ and E$_2$ are chosen from

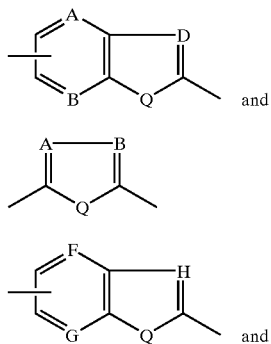

Formula IV and

Formula V and

Formula IV

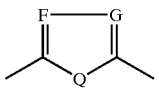
Formula V where F, G, and H are independently chosen in each ring from CH and N, and Q is chosen in each ring from S, O, NR", CHR", CR"R", CH=CH, N=N, N=CH and N=CR", wherein Z$_1$ and Z$_2$ are single bonds or a group Ar$_4$ which is selected from 1,2-phenylene, 1,3-phenylene, 1,4-phenylene, 4,4'-biphenylene, 1,4-naphthylene and 2,6-naphthylene, Z$_3$ is a phenyl, naphthyl or biphenyl group optionally substituted in one or two positions with C$_1$ to C$_6$ alkyl, R" is chosen from C$_1$ to C6 alkyl groups and aryl groups and n=0, 1 or 2, such that the hole transporting groups and electron transporting groups are statistically distributed along the polymer chain and the degree of polymerisation polymerization of the statistical copolymer is 10–50000.

* * * * *